(12) United States Patent
Kondo et al.

(10) Patent No.: US 10,178,736 B2
(45) Date of Patent: Jan. 8, 2019

(54) LIGHT EMITTING APPARATUS AND OPTICAL TRANSMITTING APPARATUS

(71) Applicant: FUJI XEROX CO., LTD., Tokyo (JP)

(72) Inventors: Takashi Kondo, Kanagawa (JP); Junichiro Hayakawa, Kanagawa (JP); Naoki Jogan, Kanagawa (JP); Akemi Murakami, Kanagawa (JP); Jun Sakurai, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 100 days.

(21) Appl. No.: 15/585,904

(22) Filed: May 3, 2017

(65) Prior Publication Data

US 2018/0070423 A1 Mar. 8, 2018

(30) Foreign Application Priority Data

Sep. 5, 2016 (JP) .................................. 2016-172976

(51) Int. Cl.
| | |
|---|---|
| *H05B 37/02* | (2006.01) |
| *G02F 1/35* | (2006.01) |
| *H01S 5/026* | (2006.01) |
| *H01S 5/183* | (2006.01) |

(Continued)

(52) U.S. Cl.
CPC ........... *H05B 37/02* (2013.01); *G02F 1/3515* (2013.01); *H01S 5/0264* (2013.01); *H01S 5/18302* (2013.01); *H01S 5/0425* (2013.01); *H01S 5/0427* (2013.01); *H01S 5/1021* (2013.01); *H01S 5/18313* (2013.01); *H01S 5/18338* (2013.01)

(58) Field of Classification Search
CPC ... H05B 37/02; H01S 5/18302; H01S 5/0264; H01S 5/18338; H01S 5/18313; H01S 5/1021; H01S 5/0425; H01S 5/0427; G02F 1/3515
USPC ........................................................ 250/205
See application file for complete search history.

(56) References Cited

U.S. PATENT DOCUMENTS

| | | | |
|---|---|---|---|
| 8,357,888 B2 * | 1/2013 | Chau ..................... | G01J 1/1626 |
| | | | 250/205 |
| 8,488,647 B2 * | 7/2013 | Arakida ................ | H01S 5/0264 |
| | | | 372/50.1 |

(Continued)

FOREIGN PATENT DOCUMENTS

| | | |
|---|---|---|
| JP | 2006-140189 A | 6/2006 |
| JP | 2007-59770 A | 3/2007 |

(Continued)

*Primary Examiner* — Seung C Sohn
(74) *Attorney, Agent, or Firm* — Sughrue Mion, PLLC

(57) ABSTRACT

A light emitting apparatus includes: a semiconductor layer including a light emitting region that generates modulation light modulated with a first signal, and a feedback region that is configured so that a feedback mode to feed back a part of light generated in the light emitting region to the light emitting region and a monitor mode to monitor a light amount of the light generated in the light emitting region are switchable; and a controller, wherein when the modulation light is generated in the light emitting region, the controller sets the feedback region to the feedback mode, and the controller switches the feedback region to the monitor mode during at least a part of a period in which there is no first signal.

14 Claims, 8 Drawing Sheets

(51) Int. Cl.
*H01S 5/042* (2006.01)
*H01S 5/10* (2006.01)

(56) References Cited

U.S. PATENT DOCUMENTS

2008/0251794 A1 10/2008 Koda et al.
2015/0043605 A1 2/2015 Koyama et al.

FOREIGN PATENT DOCUMENTS

| JP | 2008-258270 A | 10/2008 |
| JP | 2015-32801 A | 2/2015 |

\* cited by examiner

LIGHT EMITTING APPARATUS AND OPTICAL TRANSMITTING APPARATUS

CROSS-REFERENCE TO RELATED APPLICATIONS

This application is based on and claims priority under 35 USC 119 from Japanese Patent Application No. 2016-172976 filed Sep. 5, 2016.

BACKGROUND

Technical Field

The present invention relates to a light emitting apparatus and an optical transmitting apparatus.

SUMMARY

According to an aspect of the invention, a light emitting apparatus includes:
a semiconductor layer including
a light emitting region that generates modulation light modulated with a first signal, and
a feedback region that is configured so that a feedback mode to feed back a part of light generated in the light emitting region to the light emitting region and a monitor mode to monitor a light amount of the light generated in the light emitting region are switchable; and
a controller, wherein
when the modulation light is generated in the light emitting region, the controller sets the feedback region to the feedback mode, and
the controller switches the feedback region to the monitor mode during at least a part of a period in which there is no first signal.

BRIEF DESCRIPTION OF THE DRAWINGS

Exemplary embodiments of the present invention will be described in detail based on the following figures, wherein.

DETAILED DESCRIPTION

Hereinafter, exemplary embodiments of the present invention will be described in detail with reference to the accompanying drawings. The light emitting device constituting a light emitting apparatus according to the exemplary embodiment is a feedback part integrated light emitting device that is integrated with a feedback part generating feedback light for improving a modulation speed in the light emitting device.

[First Exemplary Embodiment]

A light emitting apparatus according to an exemplary embodiment is described with reference to FIGS. 1 to 7.

Figure 1:
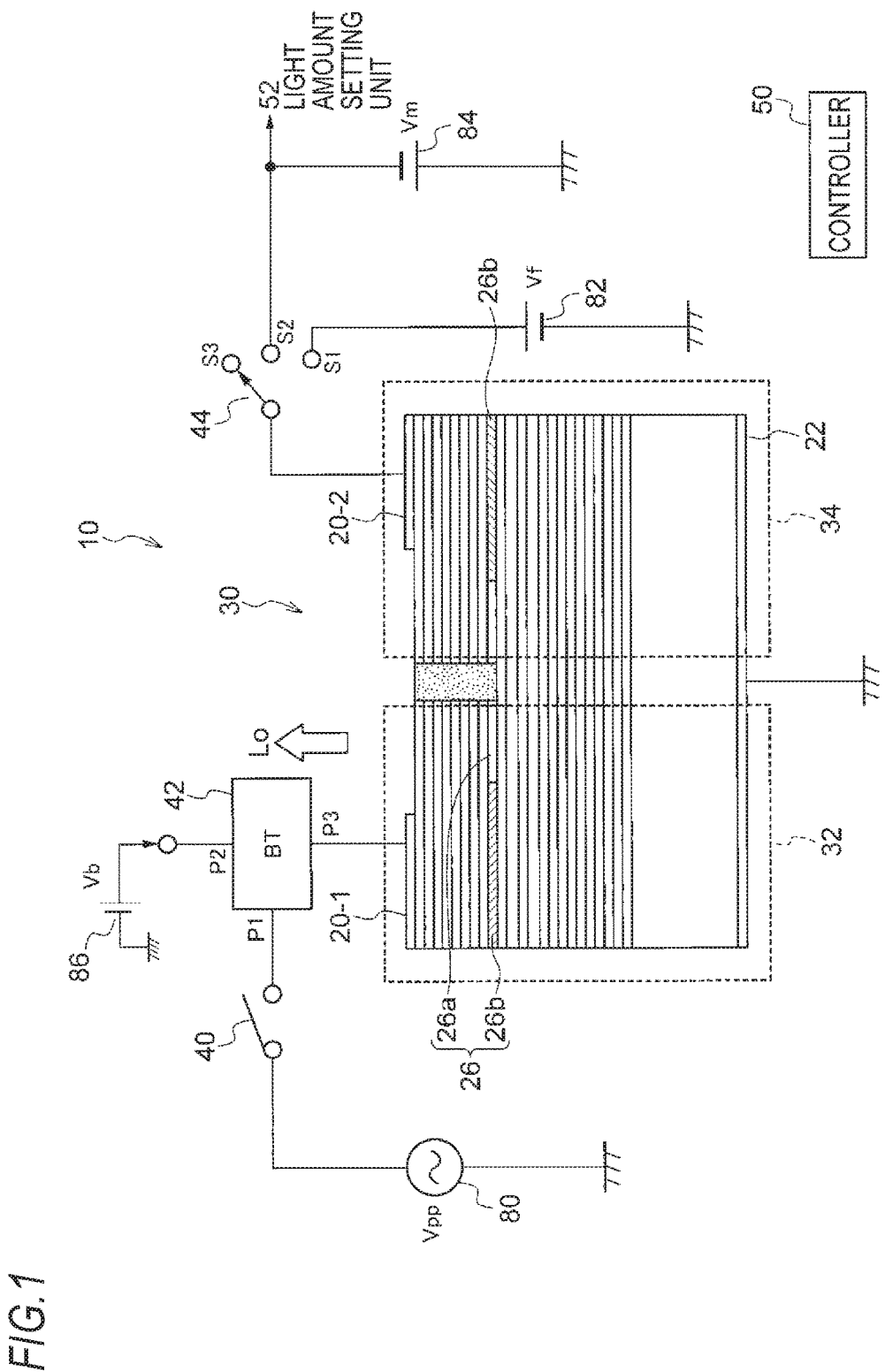
FIG. 1 is a diagram illustrating an example of a configuration of a light emitting apparatus according to a first exemplary embodiment.

FIG. 1 is a block diagram illustrating a light emitting apparatus 10 together with a signal source and each power supply according to an exemplary embodiment. As illustrated in FIG. 1, the light emitting apparatus 10 includes a light emitting device 30 and a controller 50. A switch 40, a switch 44, and a bias tee (expressed as 'BT' in FIG. 1) 42 illustrated in FIG. 1 constitute a part of the controller 50.

As illustrated in FIG. 1, the light emitting device 30 according to the exemplary embodiment includes a light emitting part 32 (a light emitting region) and a feedback part 34 (a feedback region). The light emitting part 32 according to the exemplary embodiment is a portion that generates output light Lo to be output from the light emitting apparatus 10. The light emitting part 32 is, for example, a vertical cavity surface emitting laser (VCSEL). Meanwhile, the feedback part is primarily configured as a semiconductor optical amplifier (SOA) that amplifies and feeds back a part of the light generated by the light emitting part 32.

The feedback part 34 according to the exemplary embodiment has a function as a monitor photodiode (hereinafter, referred to as 'monitor PD') monitoring the light amount of the light emitted from the light emitting part 32 in addition to a function as the SOA. That is, the feedback part 34 according to the exemplary embodiment has both the function of the SOA and the function of the monitor PD. The function of the SOA and the function of the monitor PD are used according to two operation modes of the light emitting device 30 which will be described below in detail. That is, in an 'optical data signal transmission mode' to output an optical data signal modulated with a data signal from the light emitting part 32, the feedback part 34 serves as the SOA and in a 'light amount monitor mode' to monitor the light amount of the light emitted from the light emitting part 32, the feedback part 34 serves as the monitor PD.

In more detail, in the optical data signal transmission mode, the feedback part 34 propagates and reflects leak light Lm (which will be described below) from the light emitting part 32 and feeds back the transmitted and reflected leak light Lm to the light emitting part 32. In the light emitting device 30, the feedback part 34 feeds back apart of oscillation light to the light emitting part 32 to enhance a modulation speed at the time of modulating the light emitting part 32 with the data signal. Meanwhile, in the light amount monitor mode, the feedback part 34 propagates the leak light Lm (which will be described below) from the light emitting part 32 and converts the transmitted leak light Lm into photocurrent to monitor the light amount of the light emitted by the light emitting part 32. As illustrated in FIG. 1, the light emitting part 32 and the feedback part 34 according to the exemplary embodiment are formed by a common semiconductor layer.

A p-side electrode wiring 20-1 is formed on an upper surface of the light emitting part 32, a p-side electrode wiring 20-2 is formed on an upper surface of the feedback part 34, and an n-side electrode wiring 22 (backside electrode) is formed on a rear surface side of the light emitting device 30. Hereinafter, the p-side electrode wirings 20-1 and 20-2 may be collectively referred to as a 'p-side electrode wiring 20'.

The bias tee 42 is a 3-terminal passive circuit that prevents a DC signal and an AC signal from influencing each other to synthesize the AC signal and the DC signal and supplies the synthesized signal to the light emitting device 30. As illustrated in FIG. 1, a terminal P1 of the bias tee 42 is connected to an AC signal source 80 generating an AC signal Vpp via the switch 40, a terminal P2 is connected to a power supply 86 generating DC bias voltage Vb, and a terminal P3 is connected to the p-side electrode wiring 20-1. The AC signal Vpp is modulated with a data signal (not illustrated) and the modulated data signal is applied to the light emitting device 30, and as a result, output light Lo (optical data signal) modulated by the data signal is output from the light emitting device 30. DC bias voltage Vb is voltage for biasing the light emitting device 30 in a forward direction. The switch 40 is a switch that changes whether the AC signal Vpp is applied to the light emitting device 30 (connection/non-connection).

Meanwhile, a power supply 82 generating forward bias voltage Vf or a power supply 84 generating monitor bias voltage Vm is connected to the p-side electrode wiring 20-2 via a switch 44. The switch 44 has three contacts S1, S2, and S3, and the power supply 82 is connected to the contact S1 and the power supply 84 is connected to the contact S2. The forward bias voltage Vf is forward bias voltage applied to the feedback part 34 in the optical data signal transmission mode. Further, the monitor bias voltage Vm is a reverse bias voltage applied to the feedback part 34 in the light amount monitor mode. As a result, the contact S2 of the switch 44 is also connected to a light amount setting unit 52 (which will be described below) of the controller 50. Meanwhile, nothing is connected to the contact S3 of the switch 44 and the contact S3 is used for opening the p-side electrode wiring 20-2.

Figure 2:
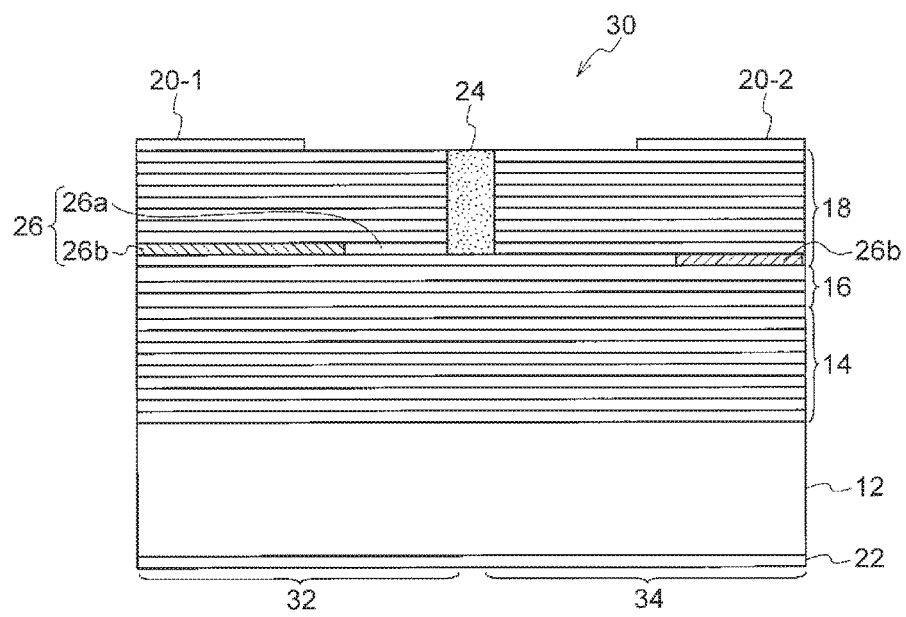
FIG. 2 is a cross-sectional view illustrating an example of the configuration of a light emitting device according to the first exemplary embodiment.

Subsequently, the light emitting device 30 according to the exemplary embodiment will be described in more detail with reference to FIG. 2. As illustrated in FIG. 2, the light emitting device 30 has a lower distributed Bragg reflector (DBR) 14 formed on a substrate 12, an active region 16 formed on the lower DBR 14, and an upper DBR 18 formed on the active region 16. Further, an oxide confinement layer 26 is formed in the upper DBR 18 and a current blocking region 24 is formed between the light emitting part 32 and the feedback part 34. As described above, the n-side electrode wiring 22 is formed on a rear surface of the substrate 12.

In the exemplary embodiment, an n-type GaAs substrate is used as an example of the substrate 12, the lower DBR 14 is of an n type, and the upper DBR 18 is of a p type. However, polarities of the substrate 12, the lower DBR 14, and the upper DBR 18 are not limited thereto. Opposite polarities may be employed, that is, the substrate 12 may be a p-type GaAs substrate, the lower DBR 14 may be of a p type, and the upper DBR 18 may be of an n type.

The lower DBR 14 makes a pair with the upper DBR 18 described below to constitute a resonator that contributes to emission in the light emitting device 30 (VCSEL). The lower DBR 14 is a multilayer reflection mirror configured by alternately repeatedly stacking two semiconductor layers each having a film thickness of 0.25 $\lambda$/n and a different refractive index when an oscillation wavelength of the light emitting device 30 is $\lambda$ and the refractive index of a medium (semiconductor layer) is n. As a specific example, the lower DBR 14 is configured by alternately repeatedly stacking an n-type low refractive index layer made of $Al_{0.90}Ga_{0.1}As$ and an n-type high refractive index layer made of $Al_{0.2}Ga_{0.8}As$.

The active region 16 according to the exemplary embodiment may include, for example, a lower spacer layer, a quantum well active layer, and an upper spacer layer (not illustrated). The quantum well active layer according to the exemplary embodiment may be configured with four barrier layers made of $Al_{0.3}Ga_{0.7}As$ and three quantum well layers made of GaAs, which are disposed between the barrier layers. Further, the lower spacer layer and the upper spacer layer are disposed between the quantum well active layer and the lower DBR 14 and between the quantum well active layer and the upper DBR 18, respectively, to have a function to adjust the length of the resonator and a function as a clad layer for confining carriers.

The oxide confinement layer 26 disposed on the active region 16 is a p-type current confinement layer and includes a non-oxidized region 26a and an oxidized region 26b. The oxidized region 26b is formed by oxidizing a semiconductor layer which is formed in a process of manufacturing the light emitting device 30, from the periphery of the semiconductor layer. Therefore, the non-oxidized region 26a according to the exemplary embodiment is continuously formed throughout the feedback part 34 from the light emitting part 32. The current which flows from the p-side electrode wiring 20 to the n-side electrode wiring 22 is tightened by the oxidized region 26b.

The upper DBR 18 is a multilayer reflection mirror configured by alternately repeatedly stacking two semiconductor layers each having a film thickness of 0.25 $\lambda$/n and a different refractive index. As a specific example, the upper DBR 18 is configured by alternately repeatedly stacking a p-type low refractive index layer made of $Al_{0.90}Ga_{0.1}As$ and a p-type high refractive index layer made of $Al_{0.2}Ga_{0.8}As$. An output plane protection layer that protects an output plane of the light may be provided on the upper DBR 18.

The current blocking region 24 (separation region) is provided between the light emitting part 32 and the feedback part 34 and electrically separates the light emitting part 32 and the feedback part 34 from each other. The current blocking region 24 is used for enhancing detection accuracy of an optical output (improving a signal to noise (S/N) ratio) by electrically separating at least portions of the light emitting part 32 and the feedback part 34 from each other. It should be noted that the current blocking region 24 is not essential. That is, the current blocking region 24 may not be used according to tolerance of the detection accuracy.

As illustrated in FIG. 2, the current blocking region 24 is formed in the upper DBR 18 from an upper surface of the semiconductor layer of the light emitting device 30 to the oxide confinement layer 26. The current blocking region 24 according to the exemplary embodiment is a high-resistance region formed by implanting H+ (proton) ions as an example. The current blocking region 24 according to the exemplary embodiment prevents crosstalk of current between the light emitting part 32 and the feedback part 34. A way of forming the current blocking region 24 is not limited to ion implantation. For example, a groove may be formed in the upper DBR 18 through the oxide confinement layer 26 from the upper surface of the semiconductor layer of the light emitting device 30 to provide the current blocking region 24.

Figure 3:
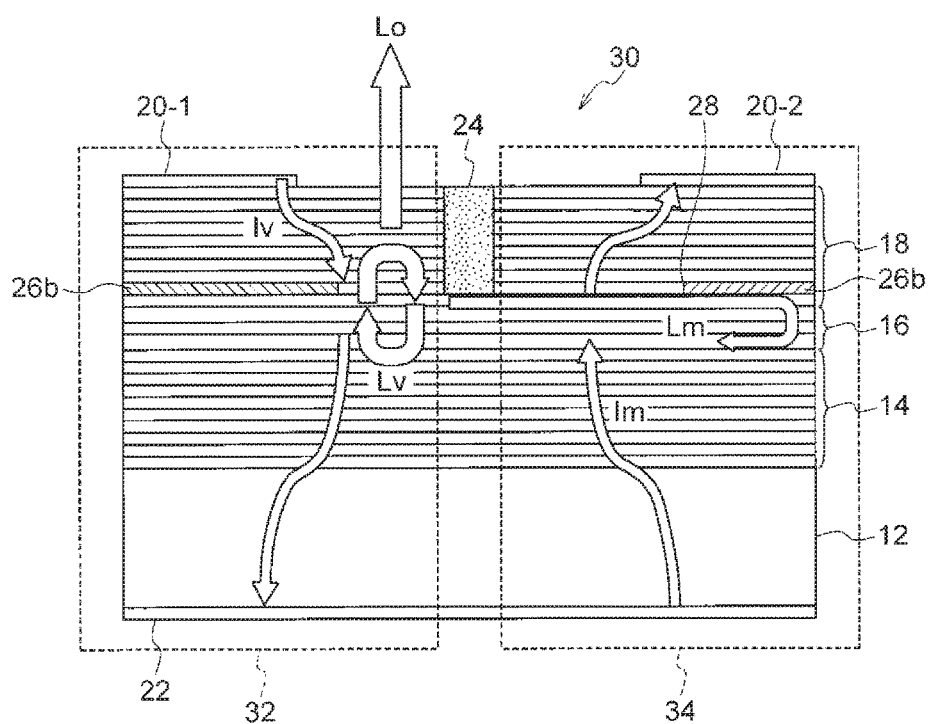
FIG. 3 is a cross-sectional view for describing an operation of the light emitting device according to the first exemplary embodiment.

Subsequently, an operation of the light emitting device 30 according to the exemplary embodiment will be described with reference to FIG. 3. FIG. 3 illustrates a cross-sectional view of the light emitting device 30 viewed at a location illustrated in FIG. 2.

As described above, the light emitting part 32 according to the exemplary embodiment is configured with the VCSEL. A general VCSEL includes a pair of distributed Bragg reflectors (corresponding to the lower DBR 14 and the upper DBR 18) disposed on the semiconductor substrate (corresponding to the substrate 12) and the active region (corresponding to the active region 16 including the active layer, the lower spacer layer, and the upper spacer layer) disposed between a pair of distributed Bragg reflectors. In addition, the current is injected into the active layer by the electrodes (corresponding to the p-side electrode wiring 20 and the n-side electrode wiring 22) disposed at both sides of the distributed Bragg reflector and a laser is oscillated vertically to a substrate plane to output light oscillated from the top of the device.

Even in the light emitting device 30 according to the exemplary embodiment, drive current Iv flows between the p-side electrode wiring 20-1 and the n-side electrode wiring 22, and as a result, oscillation light Lv is generated between the lower DBR 14 and the upper DBR 18, as illustrated in FIG. 3. In addition, a part of the oscillation light Lv as the output light Lo is output from the light emitting part 32.

Meanwhile, in the light emitting device 30 according to the exemplary embodiment, a part of the oscillation light Lv leaks in a direction (a direction orthogonal to a stacking direction of the respective layers of the light emitting device 30, hereinafter, this direction may be referred to as a 'horizontal direction') parallel to the substrate 12 to be the leak light Lm and then, further leaks to the feedback part 34 as illustrated in FIG. 3. The reason is that the oxidized region 26b is formed around the light emitting device 30 according to the exemplary embodiment, and as a result, the non-oxidized region 26a is formed from the light emitting part 32 to the feedback part 34. That is, when the semiconductor layer is oxidized, the refractive index generally deteriorates, and as a result, the refractive index of the non-oxidized region 26a is higher than the refractive index of the oxidized region 26b. A part of the oscillation light Lv generated in the light emitting part 32 becomes the leak light Lm by a difference in refractive index and leaks to the feedback part 34.

The leak light Lm which leaks to the feedback part 34 is propagated in the horizontal direction while being resonated by the resonator by the lower DBR 14 and the upper DBR 18 in the state where the leak light Lm is inclined at a predetermined inclination angle. As a result, a propagation time of the leak light Lm is delayed as compared with light which is propagated straightly in a horizontal direction, and as a result, the leak light Lm becomes a so-called slow light state. In the feedback part 34 according to the exemplary embodiment, the leak light Lm is used for two purposes. That is, in the optical data signal transmission mode in which the light emitted from the light emitting part 32 is transmitted toward an optical transmission path 150 (see FIG. 8), the leak light Lm is fed back toward the light emitting part 32 from the feedback part 34. Meanwhile, in the light amount monitoring mode to monitor the light amount of the output light Lo output from the light emitting part 32, the leak light Lm is converted into light receiving current (monitor current) which is approximately proportional to the light amount of the output light Lo.

First, the operation of the feedback part 34 in the optical data signal transmission mode is described. In the optical data signal transmission mode, the forward bias voltage Vf (see FIG. 1) is applied to the p-side electrode wiring 20-2. In such a state, the feedback part 34 serves as the SOA that amplifies the leak light Lm.

Specifically, the leak light Lm is propagated into the non-oxidized region 26a of the feedback part 34 in the horizontal direction and thereafter, reflected on a light reflecting part provided on the end portion. The light reflecting part according to the exemplary embodiment uses a change in refractive index and the leak light Lm is reflected on a boundary 28 of the non-oxidized region 26a and the oxidized region 26b of the feedback part 34. The light reflected on the feedback part 34 is fed back (optical feedback) to the resonator of the light emitting part 32 again while being propagated to the oxidized region 26b. Meanwhile, the light reflecting part does not necessarily use the change in refractive index. Another light reflecting member may be attached to the end portion of the feedback part 34.

Since the leak light Lm is propagated into the feedback part 34 in the horizontal direction while the leak light Lm is repeatedly reflected between the lower DBR 14 and the upper DBR 18 of the feedback part 34 until the leak light Lm is fed back to the light emitting part 32, the leak light Lm passes through the active region 16 several times. As a result, the leak light Lm is efficiently amplified in the feedback part 34 and thereafter, fed back to the light emitting part 32. Further, in the optical data signal transmission mode, the leak light Lm need not particularly be amplified and may be fed back to the light emitting part 32 as it is. In this case, since the forward bias voltage Vf need not be applied to the p-side electrode wiring 20-2 of the feedback part 34, the switch 44 is connected to the contact S3 and the p-side electrode wiring 20-2 is opened. In this case, the feedback part 34 is considered as, in other words, the SOA having a gain of approximately 1.

Meanwhile, in the light amount monitor mode, used is a characteristic that the leak light Lm is approximately proportional to the light amount of the output light Lo output from the light emitting part 32. That is, in the light amount monitor mode, the monitor bias voltage Vm (see FIG. 1) is applied to the p-side electrode wiring 20-2 to allow the feedback part 34 to serve as the monitor PD that converts the leak light Lm into the current. As described above, the leak light Lm that leaks from the light emitting part 32 passes through the active region 16 several times while being propagated to the feedback part 34. As a result, in the light amount monitor mode in which the monitor bias voltage Vm is applied to the feedback part 34, monitor current Im by the leak light Lm is efficiently generated.

As described above, in the light emitting device 30 according to the exemplary embodiment, which has such a configuration, the light emitting part 32 and the feedback part 34 are optically coupled to each other to configure a coupling resonator. As a result, in the optical data signal transmission mode, a part of the oscillation light Lv generated in the light emitting part 32 becomes the leak light Lm to be propagated to the feedback part 34 and is efficiently amplified in the feedback part 34 as the SOA to return to the light emitting part 32 again. Therefore, the modulation speed in the light emitting part 32 is enhanced. Meanwhile, in the light amount monitor mode, a part of the oscillation light Lv generated in the light emitting part 32 becomes the leak light Lm to be propagated to the feedback part 34 and efficiently converted into the monitor current in the feedback part 34 as the monitor PD.

Figure 4:
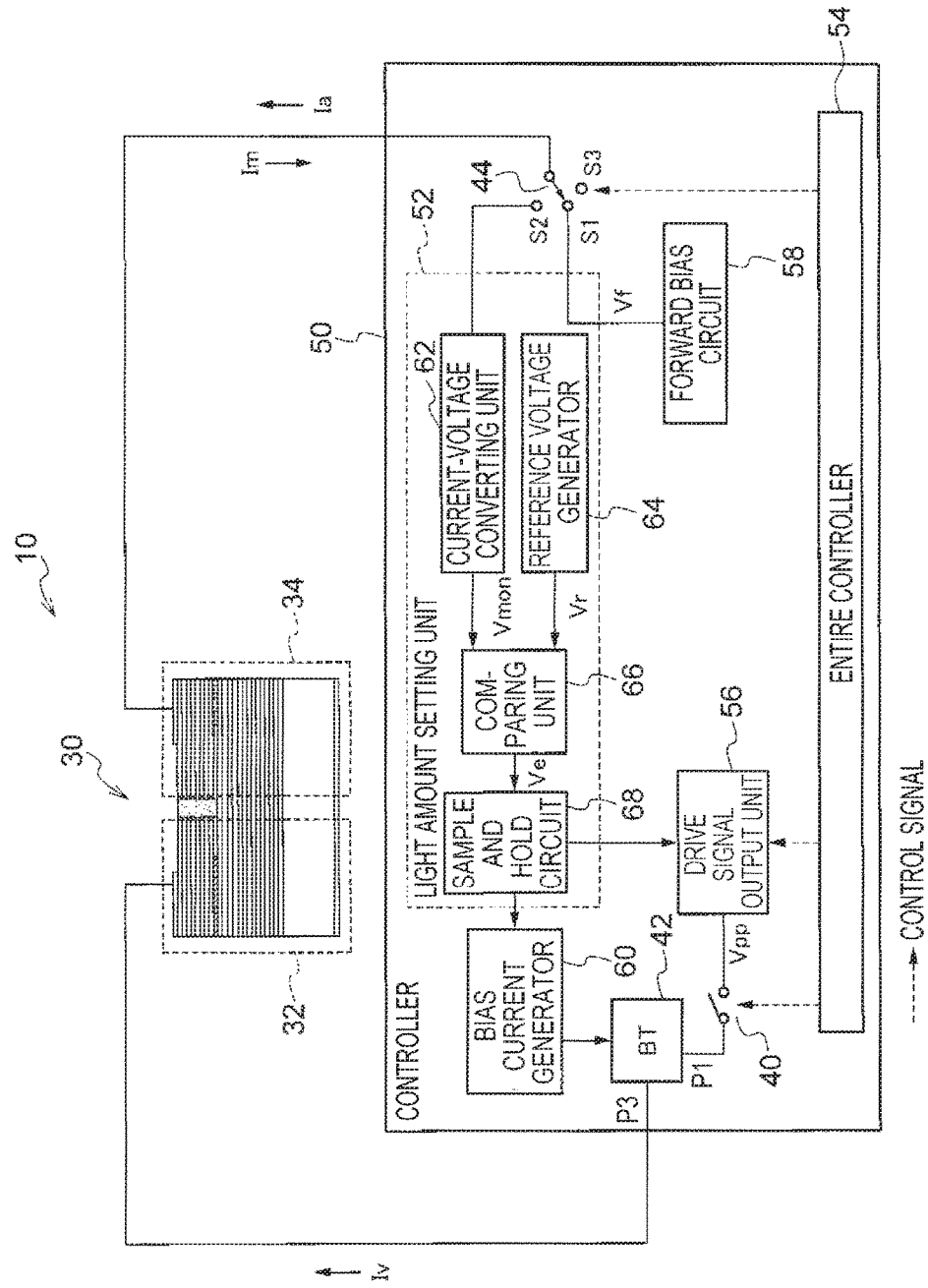
FIG. 4 is a block diagram illustrating an example of the configuration of a controller of the light emitting apparatus according to the first exemplary embodiment.
Figure 5A:
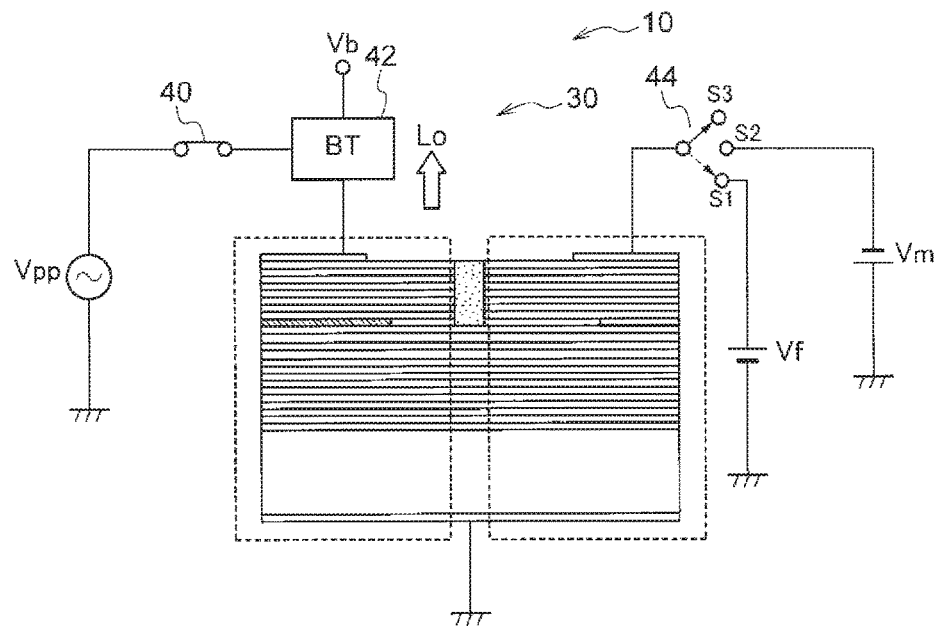
FIGS. 5A and 5B are diagrams for describing a change of a switch in an optical data signal transmission mode and the change of the switch in a light amount monitor mode in the light emitting apparatus according to the first exemplary embodiment.
Figure 5B:
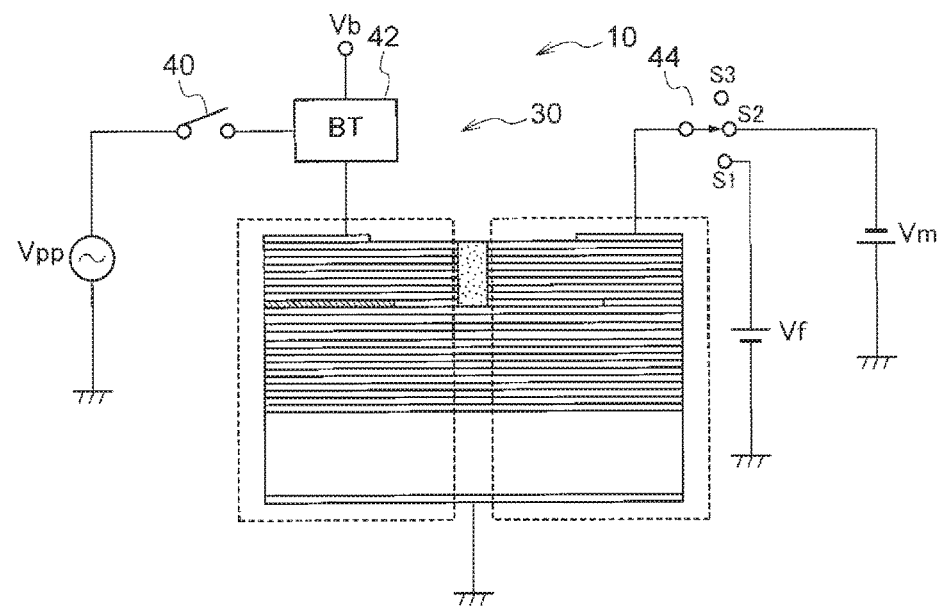

Subsequently, the controller 50 according to the exemplary embodiment will be described in more detail with reference to FIGS. 4 to 5B. FIG. 4 is a block diagram illustrating an example of a configuration of the controller. FIG. 5A is a diagram illustrating connection of the switch 40 and the switch 44 in the optical data signal transmission mode. FIG. 5B is a diagram illustrating the connection of the switch 40 and the switch 44 in the light amount monitor mode.

Semiconductor lasers (not limited to VCSELs) may be required to be stabilized so that an optical output is not fluctuated due to change in temperature or change in power. A stabilization method detects the optical output of the semiconductor laser as a monitor current by a monitor PD, compares the detected monitor current with a reference value to acquire a difference value, and change a drive current using the difference value to negative feedback control the optical output of the semiconductor laser. Hereinafter, controlling the semiconductor laser by such a method may be referred to as 'feedback control.'

Even in the light emitting apparatus 10 according to the exemplary embodiment, the feedback control method is used in driving the light emitting part 32 in the optical data signal transmission mode. Herein, the feedback part 34 according to the exemplary embodiment performs both the function of the SOA in the optical data signal transmission mode and the function as the monitor PD in the light amount monitor mode as described above. However, it is difficult for the feedback part 34 to simultaneously exhibit the both functions. The reason is that when the optical data signal transmission mode and the light amount monitor mode are simultaneously performed, a part of the leak light Lm is converted into light receiving current and the light amount which is fed back to the light emitting part 32 thus deteriorates, and as a result, enhancement of the modulation speed in the light emitting part 32 is impeded. Therefore, in the light emitting apparatus 10 according to the exemplary embodiment, the function of the SOA and the function of the monitor PD are configured to be switched to each other in time division. That is, the controller 50 stores a drive condition of the light emitting part 32, which is acquired by the feedback control using the monitor current in the light amount monitor mode and controls the light emitting device 30 to adjust a light emission amount in the light emitting part 32 by using the stored drive condition in the optical data signal transmission mode.

As illustrated in FIG. 4, the controller 50 is connected to the light emitting device 30 and includes a light amount setting unit 52, an entire controller 54, a drive signal output unit 56, the bias tee 42, a bias current generator 60, a forward bias circuit 58, and the switches 40 and 44.

The entire controller 54 includes, for example, a central processing unit (CPU) (not illustrated) and totally controls the entirety of the controller 50 including the drive signal output unit 56, the switches 40 and 44, and like.

The drive signal output unit 56 supplies the AC signal Vpp supplied from the AC signal source 80 (see FIG. 1), that is, the modulation signal of the light emitting device 30 to the light emitting part 32 of the light emitting device 30 via the switch 40 and the bias tee 42. At that time, the entire controller 54 controls the switch 40 to be closed (turned on) in the optical data signal transmission mode as illustrated in FIG. 5A. As a result, in the optical data signal transmission mode, the drive current Iv in which the AC signal Vpp is superimposed on a bias current is supplied to the light emitting part 32. Meanwhile, the entire controller 54 controls the switch 40 to open (turn off) the switch 40 in the light amount monitor mode. However, in the light amount monitor mode, the switch 40 is turned off to prevent the AC signal Vpp from being applied, but the light emitting part 32 needs to emit light, and as a result, a low speed AC signal or DC signal is supplied, which has a level enough not to generate the feedback light in the feedback part 34 instead of the AC signal Vpp. Herein, when the DC signal is supplied, a power supply 86 supplying DC bias voltage Vb may be used.

The entire controller 54 controls the switch 44 to be connected to the contact S1 or S3 in the optical data signal transmission mode as illustrated in FIG. 5A. The forward bias circuit 58 to which the forward bias voltage Vf is supplied from the power supply 82 (see FIG. 1) is connected to the contact S1. When the switch 44 is connected to the contact S1 by the entire controller 54, the forward bias voltage Vf is applied to the feedback part 34 as the SOA, and as a result, a drive current Ia is supplied. Further, when the switch 44 is connected to the contact S3 by the entire controller 54, the p-side electrode wiring 20-2 (see FIG. 3) of the feedback part 34 is opened, and as a result, the drive current Ia is not supplied. As described above, in this case, the leak light Lm is fed back to the light emitting part 32 without amplification in the feedback part 34. Whether the switch 44 is connected to the contact S1 or S3 may be set in advance in view of the modulation speed required in the light emitting apparatus 10, and the like.

Meanwhile, in the light amount monitor mode, the entire controller 54 controls the switch 44 to be connected to the contact S2 as illustrated in FIG. 5B. The power supply 84 (see FIG. 1) supplying the monitor bias voltage Vm is connected to the contact S2 and when the switch 44 is connected to the contact S2, a reverse bias is applied to the feedback part 34 as the monitor PD. The monitor bias voltage Vm generally becomes negative voltage, but the feedback part 34 serves as the PD even though the reverse bias is not applied, and as a result, the monitor bias voltage Vm may be 0 V (ground potential). When the monitor bias voltage Vm is applied to the feedback part 34 as the monitor PD, monitor current Im is generated in the feedback part 34.

The light amount setting unit 52 includes a current-voltage converting unit 62, a reference voltage generator 64, a comparing unit 66, and a sample and hold circuit 68. The current-voltage converting unit 62 inputs the monitor current Im generated by the feedback part 34 of the light emitting device 30 to convert the monitor current Im into monitor voltage Vmon. The monitor voltage Vmon is proportional to the light amount of the output light Lo similarly to the monitor current Im. The reference voltage generator 64 is a portion that generates reference voltage Vr for the monitor voltage Vmon and the reference voltage Vr determines a target value of the optical output in the light emitting part 32. Further, the current-voltage converting unit 62 is configured with, for example, a resistor that generate the monitor voltage Vmon which is proportional to the monitor current Im upon the monitor current Im flowing through the resistor. At that time, the resistance may be used as a load by using a current mirror circuit that generates the current which is proportional to the monitor current Im by inputting the monitor current Im.

The comparing unit 66 is a portion that compares the monitor voltage Vmon and the reference voltage Vr with each other to generate error voltage Ve and in the feedback control, the error voltage Ve is controlled to be close to zero. In the light amount monitor mode, the DC signal or a low frequency signal is applied to the p-side electrode wiring 20-1 and the light emitting part 32 thus emits the light, and as a result, the controller 50 feedback controls the light emitting device 30 through the monitor current Im. The sample and hold circuit 68 holds the error voltage Ve at the time when the feedback control is stable.

The bias current generator 60 is a portion that generates the bias current depending on the error voltage Ve and negatively feeds back the generated bias current to the light emitting part 32 of the light emitting device 30. The bias current generated by the bias current generator 60 synchronizes with the AC signal Vpp in the bias tee 42 to be supplied to the light emitting part 32 of the light emitting device 30 as the drive current Iv. In the optical data signal transmission mode, the output light Lo in the light emitting part 32 of the light emitting device 30 is controlled based on the error voltage Ve. In the light emitting device 30, the optical output of the light emitting apparatus 10 is controlled by the controller 50 configured as above to stabilize the optical output. Further, the error voltage Ve is supplied to the drive signal output unit 56, and for example, the amplitude of the AC signal Vpp is controlled by the error voltage Ve to control the optical output of the light emitting apparatus 10.

Figure 6A:
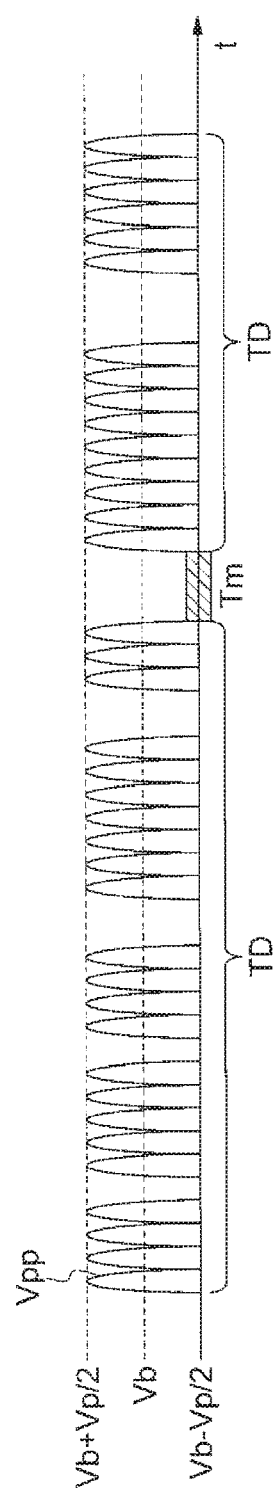
FIGS. 6A and 6B are timing charts illustrating a drive waveform of a light emitting part and the drive waveform of a feedback part in the light emitting apparatus according to the first exemplary embodiment.
Figure 6B:
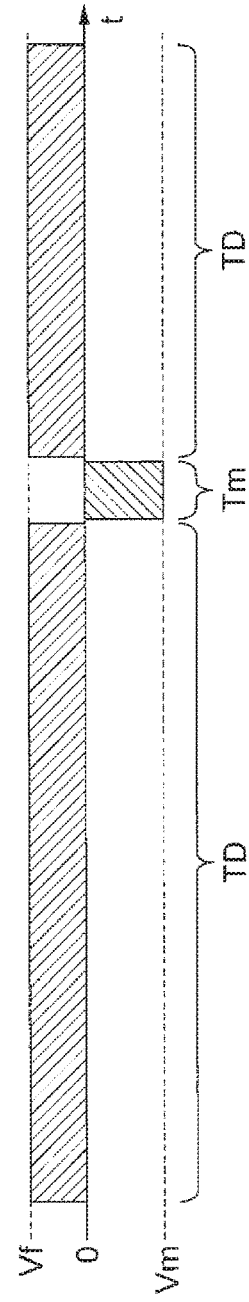

Subsequently, the time-division control of the light emitting apparatus 10 in the optical data signal transmission mode and the light amount monitor mode in the light emitting apparatus 10 will be described in more detail with reference to FIGS. 6A and 6B. FIG. 6A illustrates a timing chart of a voltage waveform applied to the p-side electrode wiring 20-1 of the light emitting part 32 in each mode. FIG. 6B illustrates a timing chart of the voltage waveform applied to the p-side electrode wiring 20-2 of the feedback part 34 in each mode.

As illustrated in FIG. 6A, the timing chart of the light emitting apparatus 10 according to the exemplary embodiment is divided into a data transmission period TD in which the optical data signal transmission mode is executed and a monitor period Tm in which the light amount monitor mode is executed. In the exemplary embodiment, the monitor period Tm in which a monitor value of the light amount is just acquired is set to be smaller than the data transmission period TD in which communication is performed with a light receiving apparatus opposite to the light emitting apparatus 10.

As illustrated in FIG. 6A, during the data transmission period TD, the AC signal Vpp of an amplitude Vp (peak-to-peak value) is supplied to the light emitting part 32. FIG. 6A illustrates a form in which the DC bias voltage Vb is applied to the center of the amplitude of the AC signal Vpp. Meanwhile, as illustrated in FIG. 6A, during the monitor period Tm, the AC signal Vpp is not supplied and instead of the AC signal Vpp, the low speed AC signal or DC signal (a frequency lower than a frequency of a signal transmitted in the optical data signal transmission mode, hereinafter, referred to as 'low speed signal') is applied to the light emitting part 32, and as a result, the drive current Iv flows. Therefore, the light emitting part 32 emits the light to monitor the light amount of the output light Lo. In this case, a correspondence between the drive current Iv by the AC signal Vpp and Iv by the low speed signal may be previously acquired by a test, a simulation, and the like.

Meanwhile, as illustrated in FIG. 6B, during the data transmission period TD, the forward bias voltage Vf is applied to the feedback part 34. However, as described above, when the feedback part 34 does not serve as the general SOA (that is, when the feedback part 34 serves as the SOA having the gain of 1), the switch 44 illustrated in FIG. 1 may be connected to the contact S3, and as a result, no signal may applied to the feedback part 34. Further, as illustrated in FIG. 6B, during the monitor period Tm, the monitor bias voltage Vm of negative voltage is applied to the feedback part 34. It should be noted that as described above, the monitor bias voltage Vm is not limited to the negative voltage. The monitor bias voltage Vm may be 0 V (ground potential).

Figure 7:
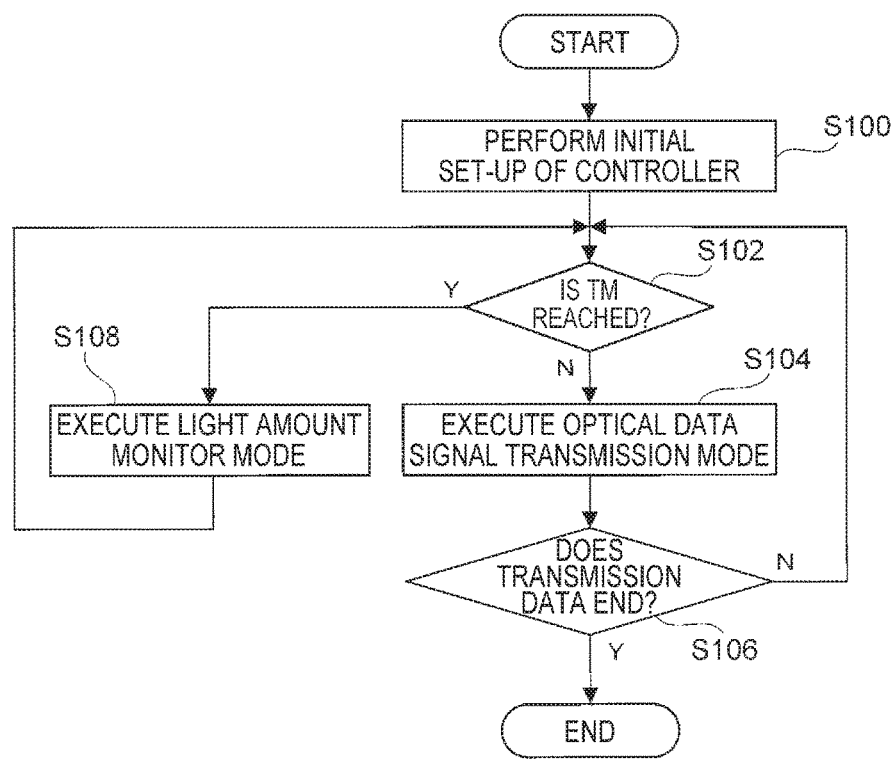
FIG. 7 is a flowchart illustrating a processing flow of a drive control processing program of the light emitting apparatus according to the first exemplary embodiment.

Subsequently, a driving control according to the exemplary embodiment will be described with reference to FIG. 7. FIG. 7 is a flowchart illustrating a flow of processing of a drive control processing program according to an exemplary embodiment. This drive control processing program is executed in the following manner. That is, a CPU (not illustrated) provided in the controller 50 reads and executes a program stored in a memory such a read only memory (ROM).

As illustrated in FIG. 7, first, an initial setup of the controller 50 is performed in step S100. In the initial setup, the mode may be once set to the light amount monitor mode and an initial value of the drive current Iv may be set. Alternatively, a predetermined set value of the drive current Iv is stored in the ROM or the like, and the stored drive current Iv may be read and set.

Next, in step S102, it is determined whether the monitor period Tm is reached. If the determination results in positive determination, the process proceeds to step S104. If the determination results in negative determination, the process proceeds to step S108. Further, the monitor period Tm and an interval of the monitor period Tm may be set according to a hold characteristic of the sample and hold circuit 68, and the like. Further, the monitor period Tm and the interval of the monitor period Tm are not limited thereto. The monitor period Tm and the interval of the monitor period Tm may be set based on a predetermined elapsed time after the power of the light emitting apparatus is input, transmission of a predetermined amount of data, a predetermined date and time, a time when a predetermined event occurs, or the like.

In step S104, the set-up is made in the light emitting apparatus 10 to execute the optical data signal transmission mode. In this step, the light emitting part 32 is driven by the initial setting or the drive current Iv set in the light amount monitor mode, while the leak light Lm is reflected in the feedback part 34 and fed back to the light emitting part 32.

Next, in step S106, whether data to be transmitted ends is determined. If the determination results in a negative determination, the process proceeds to step S102 and the process waits for the monitor period Tm. If the determination results in a positive determination, the drive control processing program ends.

If the determination results in the positive determination in step S102, since the monitor period Tm is reached, the set-up is made in the light emitting apparatus 10 to execute the light amount monitor mode. In the light amount monitor mode, a value of the drive current Iv is updated by the negative feedback control by the light amount setting unit 52. Thereafter, the process proceeds to step S102 and waits for the monitor period Tm.

[Second Exemplary Embodiment]

Figure 8:
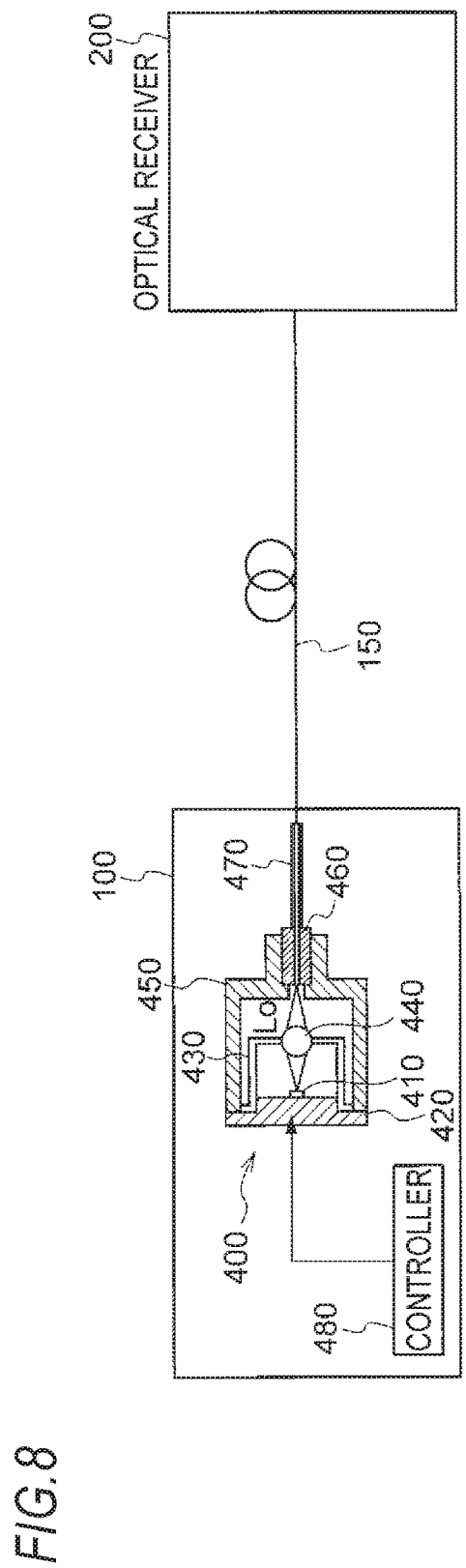
FIG. 8 is a block diagram illustrating an example of the configuration of an optical transmitting apparatus according to a second exemplary embodiment.

Subsequently, an optical transmitting apparatus according to an exemplary embodiment will be described with reference to FIG. 8. The optical transmitting apparatus 100 according to the exemplary embodiment is an apparatus constituting an optical transmitter side in an optical communication system (optical transmitting system) performed by disposing an optical transmitter and an optical receiver at both ends of the optical transmission path 150 by an optical fiber, and the like. As illustrated in FIG. 8, the optical transmitting system according to the exemplary embodiment includes the optical transmitting apparatus 100, the optical transmission path 150, and an optical receiver 200.

As illustrated in FIG. 8, the optical transmitting apparatus 100 is includes an optical transmitting module 400 and a controller 480.

The optical transmitting module 400 includes a metallic stem 420 on which an electronic component 410 including the light emitting apparatus 10 is mounted, the stem 420 is covered with a hollow cap 430, and a ball lens 440 is fixed to the center of the cap 430. A cylindrical case 450 is also attached to the stem 420 and an optical fiber 470 is fixed to an end portion of the case 450 through a ferrule 460.

Meanwhile, the controller 480 is connected with the controller 50 to perform high control such as a control of the light emitting apparatus 10 in a relationship with the optical receiver 200. Further, the AC signal source 80, and the power supplies 82, 84, and 86 are included in the controller 480 and the AC signal Vpp, the forward bias voltage Vf, the monitor bias voltage Vm, the DC bias voltage Vb, and the like are thus supplied to the controller 50. The light emitting apparatus 10 included in the electronic component 410 is driven by the controller 480 and the controller 50 to output the output light Lo. The output light Lo output from the electronic component 410 is collected by the ball lens 440 and the collected light is incident in the optical fiber 470 to be transmitted through the optical transmission path 150. Further, in addition to the ball lens, other lenses such as a biconvex lens or a planoconvex lens may be used.

Each function of the controller 50 according to each exemplary embodiment is configured by combining discrete components including an integrated circuit such as the CPU or ASIC, a transistor, an FET, an operation amplifier, and the like. Further, a control timing such as the switch, or the like may be configured as, for example, software executed by the CPU, or the like.

In each exemplary embodiment, a GaAs series using a semi-insulating GaAs substrate is described as an example. It should be noted that the present invention is not limited thereto. A substrate made of gallium nitride (GaN) or a substrate made of indium phosphide (InP) may be used.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting apparatus comprising:
a semiconductor layer including
a light emitting region that generates modulation light modulated with a first signal, and
a feedback region that is configured so that a feedback mode to feed back a part of light generated in the light emitting region to the light emitting region and a monitor mode to monitor a light amount of the light generated in the light emitting region are switchable; and
a controller, wherein
when the modulation light is generated in the light emitting region, the controller sets the feedback region to the feedback mode, and
the controller switches the feedback region to the monitor mode during at least a part of a period in which there is no first signal.

2. The light emitting apparatus according to claim 1, wherein
the semiconductor layer includes
a first multilayer reflection mirror,
an active region formed on the first multilayer reflection mirror, and
a second multilayer reflection mirror formed on the active region,
the light emitting region is configured as a surface emitting light emitting device including the first multilayer reflection mirror and the second multilayer reflection mirror as a vertical resonator,
in the feedback mode, the feedback region serves as an optical amplifier having the active region as an optical amplifying layer, and
in the monitor mode, the feedback region serves as a light receiving element having the active region as an light absorbing layer.

3. The light emitting apparatus according to claim 2, wherein
the semiconductor layer further includes an oxide layer formed around the semiconductor layer,
a non-oxidized region where no oxide layer is formed is continuously formed between the light emitting region and the feedback region,
a part of the light generated in the light emitting region propagates to the feedback region through the non-oxidized region as leak light,
in the feedback mode, the leak light is reflected and fed back to the light emitting region, and
in the monitor mode, the leak light is converted into current.

4. The light emitting apparatus according to claim 1, wherein a separation region that electrically separates the light emitting region and the feedback region is formed between the light emitting region and the feedback region.

5. The light emitting apparatus according to claim 1, wherein
when the modulation light is generated in the light emitting region, the controller applies the first signal to the light emitting region and applies a forward voltage or no voltage to the feedback region to set the feedback region to the feedback mode, and
the controller applies a reverse voltage including zero volt to the feedback region during at least apart of the period in which there is no first signal, to switch the feedback mode to the monitor mode.

6. The light emitting apparatus according to claim 1, wherein
the controller includes a light amount setting unit that generates a target drive current of the light emitting region by using the light amount monitored in the monitor mode, and
when the modulation light is generated in the light emitting region, the controller controls the light amount of the modulation light generated in the light emitting region based on the target drive current.

7. The light emitting apparatus according to claim 6, wherein
the controller applies a DC signal or a second signal having a lower frequency than the first signal to the light emitting region in the monitor mode, and
the light amount setting unit generates the target drive current by a negative feedback control and causes a hold circuit to hold the generated target drive current.

8. An optical transmitting apparatus comprising:
the light emitting apparatus according to claim 1; and
an optical coupling system in which the modulation light generated in the light emitting region is incident, the light coupling system transmitting the incident modulated light through an optical transmission path.

9. An optical transmitting apparatus comprising:
the light emitting apparatus according to claim 2; and
an optical coupling system in which the modulation light generated in the light emitting region is incident, the light coupling system transmitting the incident modulated light through an optical transmission path.

10. An optical transmitting apparatus comprising:
the light emitting apparatus according to claim 3; and
an optical coupling system in which the modulation light generated in the light emitting region is incident, the light coupling system transmitting the incident modulated light through an optical transmission path.

11. An optical transmitting apparatus comprising:
the light emitting apparatus according to claim 4; and
an optical coupling system in which the modulation light generated in the light emitting region is incident, the light coupling system transmitting the incident modulated light through an optical transmission path.

12. An optical transmitting apparatus comprising:
the light emitting apparatus according to claim 5; and
an optical coupling system in which the modulation light generated in the light emitting region is incident, the light coupling system transmitting the incident modulated light through an optical transmission path.

13. An optical transmitting apparatus comprising:
the light emitting apparatus according to claim 6; and
an optical coupling system in which the modulation light generated in the light emitting region is incident, the light coupling system transmitting the incident modulated light through an optical transmission path.

14. An optical transmitting apparatus comprising:
the light emitting apparatus according to claim 7; and
an optical coupling system in which the modulation light generated in the light emitting region is incident, the light coupling system transmitting the incident modulated light through an optical transmission path.

* * * * *